US012740046B2

(12) United States Patent
Lin

(10) Patent No.: US 12,740,046 B2
(45) Date of Patent: Sep. 15, 2026

(54) SEMICONDUCTOR DEVICE AND MANUFACTURING METHOD THEREOF

(71) Applicant: NANYA TECHNOLOGY CORPORATION, New Taipei City (TW)

(72) Inventor: Yu-Ying Lin, Tainan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 325 days.

(21) Appl. No.: 18/493,791

(22) Filed: Oct. 24, 2023

(65) Prior Publication Data

US 2024/0057311 A1 Feb. 15, 2024

Related U.S. Application Data

(62) Division of application No. 17/455,212, filed on Nov. 16, 2021, now abandoned.

(51) Int. Cl.
*H10B 12/00* (2023.01)

(52) U.S. Cl.
CPC ......... *H10B 12/315* (2023.02); *H10B 12/485* (2023.02)

(58) Field of Classification Search
CPC .... H10B 12/02; H10B 12/053; H10B 12/315; H10B 12/485
See application file for complete search history.

(56) References Cited

U.S. PATENT DOCUMENTS 6,165,870 A * 12/2000 Shim ................. H10W 10/0145 257/E21.549
6,188,100 B1 2/2001 Hermes
6,746,936 B1 * 6/2004 Lee .................. H10W 10/0145 438/296
2008/0073708 A1 3/2008 Aiso
2008/0242037 A1 * 10/2008 Sell ...................... H10D 30/797 438/299
2010/0006932 A1 1/2010 Matsubara
2019/0214455 A1 7/2019 Kang et al.
2021/0066305 A1 3/2021 Kim et al.

FOREIGN PATENT DOCUMENTS

CN 1947252 A 4/2007
JP 2001177074 A 6/2001
TW 437062 5/2001

* cited by examiner

*Primary Examiner* — Meiya Li
(74) *Attorney, Agent, or Firm* — CKC & Partners Co., LLC

(57) ABSTRACT

A semiconductor device includes a substrate, a bitline, a bitline contact and a land pad. The bitline is over the substrate. The bitline contact is in contact with a bottom of the bitline and in the substrate. The bitline contact includes a first portion and a second portion below the first portion, and the first portion is wider than the second portion from a cross-section view. A word line is adjacent to the bitline contact. A land pad is on the substrate, and the land pad is adjacent to the word line, such that the word line is between the bitline contact and the land pad.

8 Claims, 12 Drawing Sheets

SEMICONDUCTOR DEVICE AND MANUFACTURING METHOD THEREOF

CROSS-REFERENCE TO RELATED APPLICATION

The present application is a Divisional application of the U.S. application Ser. No. 17/455,212, filed Nov. 16, 2021, which is herein incorporated by reference in its entirety.

BACKGROUND

Field of Disclosure

The present disclosure relates to a semiconductor device and a manufacturing method thereof.

Description of Related Art

Random access memory (RAM) is a volatile memory, usually categorized into static RAM (SRAM) and dynamic RAM (DRAM). SRAM stores information by the conductive state of the transistors in the memory cells, while digital signals from DRAM are determined by the charging states of capacitors in the memory cells. In RAM, information access is controlled by word lines connecting gates and bitlines that connect source/drain.

SUMMARY

Some embodiments of the present provide a semiconductor device, including a substrate, a bitline, a bitline contact and a land pad. The bitline is over the substrate. The bitline contact is in contact with a bottom of the bitline and in the substrate. The bitline contact includes a first portion and a second portion below the first portion, and the first portion is wider than the second portion in a cross-section view. A word line is adjacent to the bitline contact. A land pad is on the substrate, and the land pad is adjacent to the word line, such that the word line is between the bitline contact and the land pad.

In accordance with some embodiments, a cross-section contour of the first portion of the bitline contact and a cross-section contour of the second portion of the bitline contact are discontinuous.

In accordance with some embodiments, the first portion of the bitline contact has a sidewall, a top of the sidewall of the first portion of the bitline contact is connected to the bitline, a bottom of the sidewall of the first portion of the bitline contact is connected to the second portion of the bitline contact, and the top of the sidewall of the first portion of the bitline contact is straighter than the bottom of the sidewall of the first portion of the bitline contact.

In accordance with some embodiments, the second portion of the bitline contact has a sidewall connected to the bottom of the sidewall of the first portion of the bitline contact, and the sidewall of the second portion of the bitline contact is straighter than the bottom of the sidewall of the first portion of the bitline contact.

In accordance with some embodiments, a sidewall of the first portion of the bitline contact is substantially aligned with a sidewall of the bitline.

In accordance with some embodiments, the bitline contact comprises silicon and a dopant, the dopant has a smaller atomic radius than silicon.

In accordance with some embodiments, the semiconductor device further includes a dielectric structure in the substrate and adjacent to the land pad.

In accordance with some embodiments, the semiconductor device further includes a capacitor connected with the land pad.

In accordance with some embodiments, a width of the first portion of the bitline contact is in a range from 470 angstrom to 530 angstrom, and a width of the second portion of the bitline contact is in a range from 380 angstrom to 420 angstrom.

In accordance with some embodiments, a depth of the first portion of the bitline contact is in a range from 160 angstrom to 200 angstrom, and a depth of the second portion of the bitline contact is in a range from 400 angstrom to 440 angstrom.

Some embodiments of the present provide a method of forming a semiconductor device. The method includes following steps. A first photoresist layer is formed on a substrate, and the first photoresist layer has an opening exposing a portion of the substrate. An implant region is formed in the portion of the substrate by implanting a first dopant into the substrate by using the first photoresist layer as a mask. The first photoresist layer over the substrate is removed. A second photoresist layer is formed over the substrate, and the second photoresist layer partially covers the implant region. A first etching process is performed to remove the implant region such that a recess is formed in the substrate. A second etching process is performed to remove a portion of the substrate to form a trench in the substrate, and the trench is narrower than the recess in the substrate. A semiconductive material is deposited in the recess and the trench.

In accordance with some embodiments, the method further includes doping a second dopant into the semiconductive material after depositing the semiconductive material in the recess and the trench.

In accordance with some embodiments, the second dopant has a smaller atomic radius than the semiconductive material.

In accordance with some embodiments, the first dopant is a n-type dopant.

In accordance with some embodiments, the method further includes planarizing the semiconductive material in the recess after depositing the semiconductive material in the recess and the trench.

In accordance with some embodiments, the method further includes adjusting an implantation dosage when forming the implant region in the portion of the substrate to control a depth of the recess.

In accordance with some embodiments, the method further includes adjusting an implantation energy when forming the implant region in the portion of the substrate to control a depth of the recess.

In accordance with some embodiments, performing the first etching process is such that a portion of the second photoresist layer is suspended over the recess in the substrate.

The shape of the bitline contact can enhance the tensile strain in the bitline contact. Discussed in greater detail, the bitline contact is doped with some dopants which are smaller in size than the semiconductive material, and adding the dopants can cause tensile strain in NMOS. The wider upper portion of the bitline contact can enhance the effect resulting from the tensile strain. Therefore, the tensile strain in NMOS can enhance the electron mobility and the current of NMOS.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
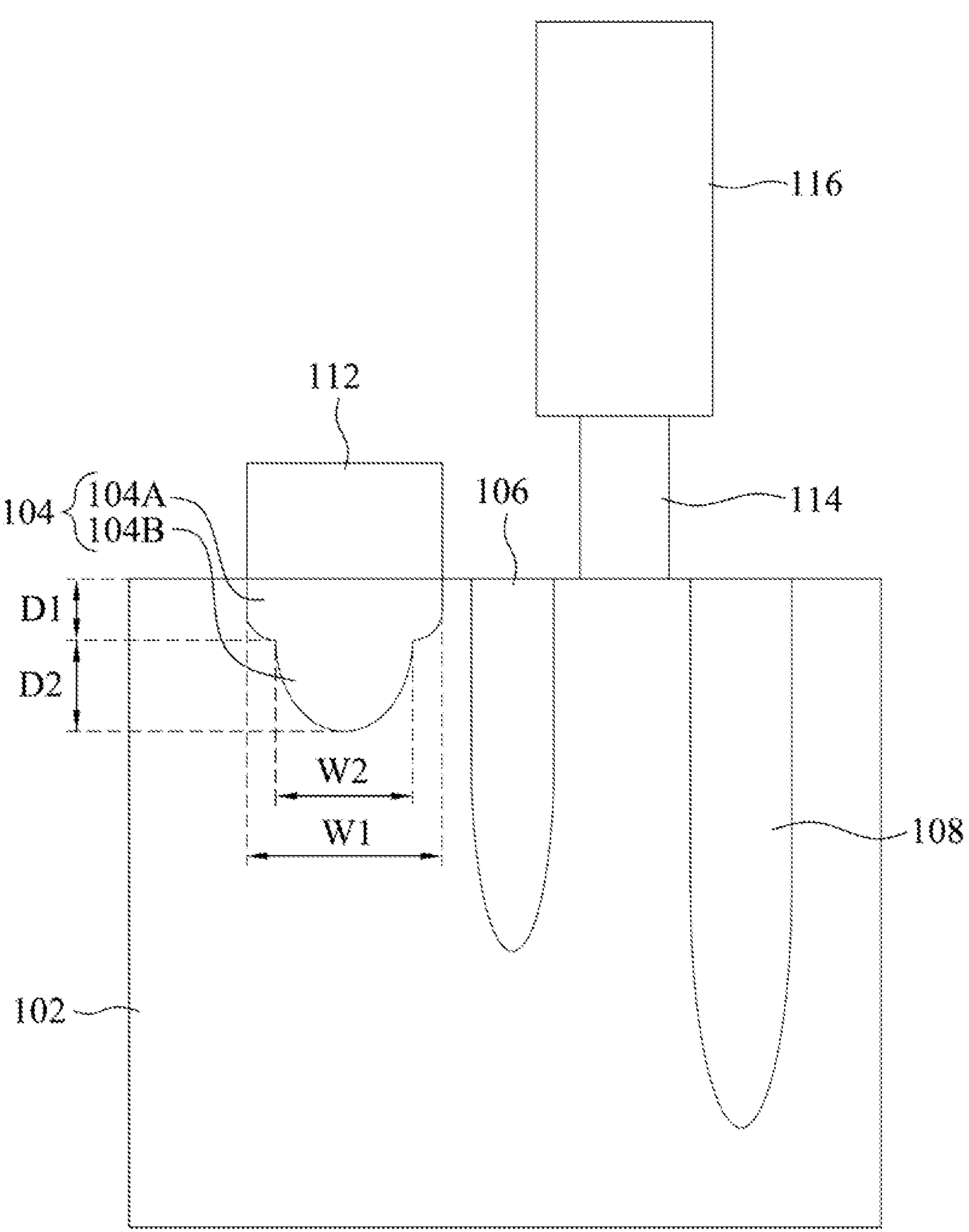
FIG. 1 illustrates a cross-section view of a semiconductor device in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Some embodiments of the present disclosure are related to a shape of a bitline contact connected to a bitline of a memory device. The bitline contact has a wider first portion and a narrower second portion below the first portion. With such shape, the bitline contact can provide tensile strain in n-type metal-oxide-semiconductor (NMOS). Therefore, the electron mobility from bitlines in NMOS is enhanced, thereby increasing current from bitlines in NMOS.

FIG. 1 illustrates a cross-section view of a semiconductor device 100 in accordance with some embodiments of the present disclosure. The semiconductor device 100 is a simplified diagram in a memory device, such as a DRAM. In some embodiments, the semiconductor device 100 includes an NMOS. Specifically, the semiconductor device 100 includes a substrate 102, a bitline contact 104, a bitline 112, and a land pad 114. The bitline 112 is over the substrate 102. The bitline contact 104 is in contact with the bottom of the bitline 112 and in the substrate 102. The bitline contact 104 includes a first portion 104A and a second portion 104B below the first portion 104A, and the first portion 104A is wider than the second portion 104B from a cross-section view. A word line 106 is adjacent to the bitline contact 104. A land pad 114 is on the substrate 102, and the land pad 114 is adjacent to the word line 106, such that the word line 106 is between the bitline contact 104 and the land pad 114.

The shape of the bitline contact 104 is designed to improve the performance of the semiconductor device 100. A cross-section contour of the first portion 104A of the bitline contact 104 and a cross-section contour of the second portion 104B of the bitline contact 104 are discontinuous. Discussed in greater detail, the first portion 104A of the bitline contact 104 has a sidewall. A top of the sidewall of the first portion 104A of the bitline contact 104 is connected to the bitline 112 and is substantially aligned with a sidewall of the bitline 112, and a bottom of the sidewall of the first portion 104A of the bitline contact 104 is connected to the second portion 104B of the bitline contact 104. The top of the sidewall of the first portion 104A of the bitline contact 104 is straighter than the bottom of the sidewall of the first portion 104A of the bitline contact 104. For example, the top of the sidewall of the first portion 104A is substantially straight, and the bottom of the sidewall of the first portion 104A is curved (e.g., convex). The second portion 104B of the bitline contact 104 has a sidewall connected to the bottom of the sidewall of the first portion 104A of the bitline contact 104, and the sidewall of the second portion 104B of the bitline contact 104 is straighter than the bottom of the sidewall of the first portion of the bitline contact 104. For example, the sidewall of the second portion 104B is substantially straight. Stated another way, the bitline 112 directly covers the bitline contact 104, and the sidewall of the second portion 104B of the bitline contact 104 is shifted inwards from the sidewall of the first portion 104A of the bitline contact 104.

In some embodiments, the bitline contact 104 includes silicon and a dopant, and the dopant has a smaller atomic radius than silicon. The "atomic radius" herein refers to the size of an atom and usually means the mean distance from the center of the nucleus of the atom to the boundary of the surrounding shells of electrons of the atom. Stated another way, the dopant is smaller than silicon in size. In some embodiments, the dopant includes carbon, phosphor, combinations thereof, or the like. The bitline contact 104 including the dopant with smaller atomic radius provides tensile strain in the bitline contact 104 of NMOS. The first portion 104A of the bitline contact 104 is formed larger in size than the second portion 104B of the bitline contact 104. Therefore, the effect resulting from the dopants in silicon is more significant, which means that the bitline contact 104 is more strained while having the shape disclosed in the present disclosure. The tensile strain can enhance the electron mobility and hence the current from the bitline 112 through the bitline contact 104 to the land pad 114. Moreover, the wider first portion 104A can also reduce the resistance of the bitline contact 104.

The bitline contact 104 has any suitable size within the scope of the present disclosure. In some embodiments, a width W1 of the first portion 104A of the bitline contact 104 is in a range from 470 angstrom to 530 angstrom, and a width W2 of the second portion 104B of the bitline contact 104 is in a range from 380 angstrom to 420 angstrom. A depth D1 of the first portion 104A of the bitline contact 104 is in a range from 160 angstrom to 200 angstrom, and a depth D2 of the second portion 104B of the bitline contact 104 is in a range from 400 angstrom to 440 angstrom. If the size of the bitline contact 104 is smaller than the disclosed range, the bitline contact 104 may be too small in size that the effect resulting from the dopants in silicon is not significant. If the size of the bitline contact 104 is greater than the disclosed range, the bitline contact 104 may be unnecessarily large and exceed the range covered by the bitline 112.

The word line 106 is in the substrate 102 and between the bitline contact 104 and the land pad 114. In some embodiments, the word line 106 is not in contact with the bitline contact 104 and the land pad 114 in the cross-section view as shown in FIG. 1. In some embodiments, another word line 106 is at the opposite side of the bitline contact 104, such that the bitline contact 104 is between two word lines 106. The bottom of the word line 106 may lower than the second portion 104B of the bitline contact 104. Therefore, the current from the bitline 112 flow through the substrate 102 below the word line 106 to the land pad 114.

In some embodiments, the semiconductor device 100 further includes a dielectric structure 108 in the substrate 102 and adjacent to the land pad 114. The dielectric structure 108 may electrically isolate different word lines and may extend downwards to a deeper level than the bottom of the word line 106. Moreover, the dielectric structure 108 and the word line 106 are at the opposite sides of the land pad 114; that is, the land pad 114 is between the dielectric structure 108 and the word line 106. In some embodiments, the semiconductor device 100 further includes a capacitor 116 connected with the land pad 114. As such, the current can flow from the bitline 112 to the capacitor 116 through the bitline contact 104, the substrate 102, and the land pad 114.

Figure 2A:
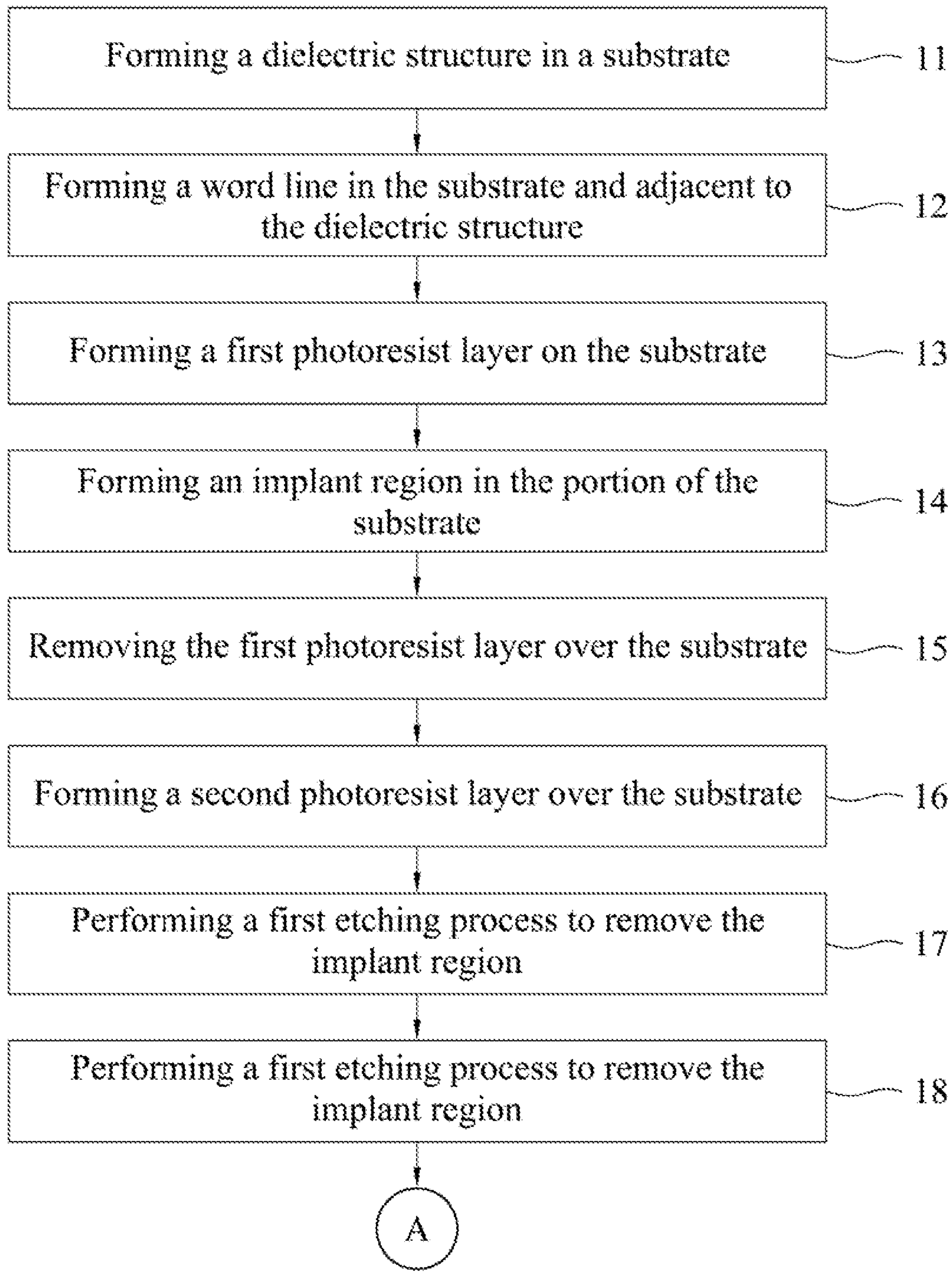
FIGS. 2A-2B illustrate a flow chart of a process of forming a semiconductor device in accordance with some embodiments of the present disclosure.
Figure 2B:
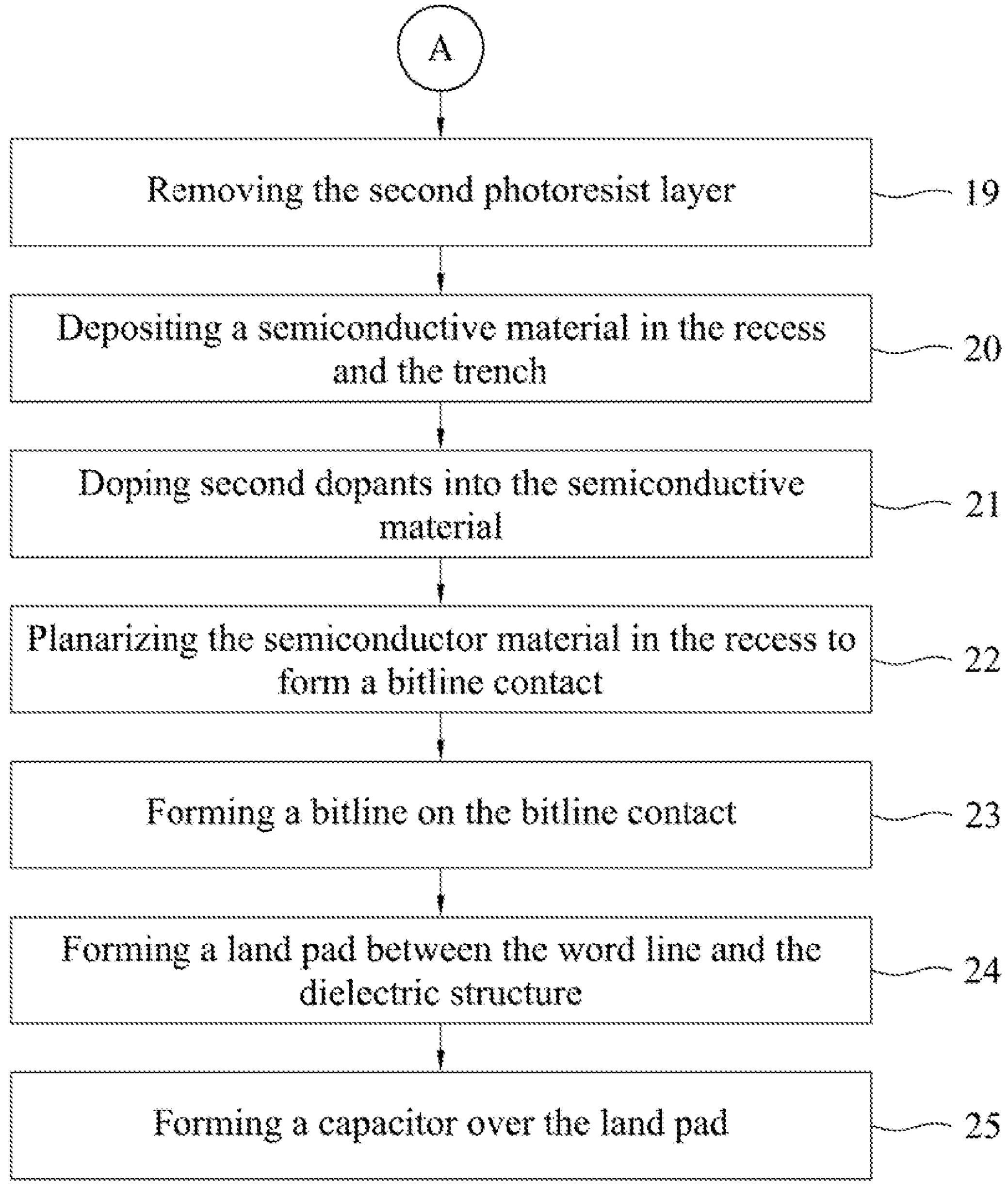
Figure 3:
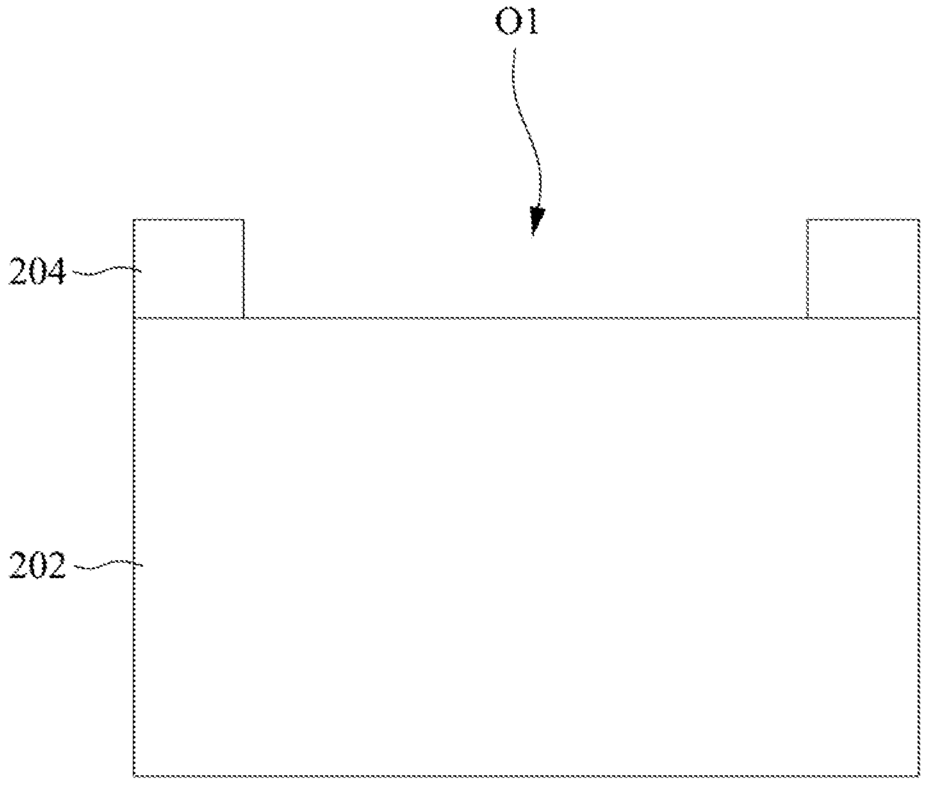
FIGS. 3-11 illustrate cross-section views of intermediate stages of forming the semiconductor device including bitline contact.

FIGS. 2A-2B illustrate a flow chart of a process 10 of forming a semiconductor device in accordance with some embodiments of the present disclosure. FIGS. 3-11 illustrate cross-section views of intermediate stages of forming the semiconductor device including bitline contact, which may be the bitline contact 104 in FIG. 1. Referring to operation 11 in FIG. 2A, a dielectric structure (such as dielectric structure 108 in FIG. 1) may be formed in the substrate (such as substrate 102 in FIG. 1). Referring to operation 12 in FIG. 2A, a word line (such as word line 106 in FIG. 1) may then be formed in the substrate and adjacent to the dielectric structure. Subsequently, referring to operation 13 in FIG. 2A and FIG. 3, a first photoresist layer 204 is formed on a substrate 202. The first photoresist layer 204 has an opening O1 exposing a portion of the substrate 202. The substrate 202 is similar to or the same as the substrate 102 in FIG. 1. The substrate 202 may include any suitable material. In some embodiments, the substrate 202 is a silicon substrate. Alternatively, the substrate 202 may include another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the first photoresist layer 204 is formed by using photolithography. More specifically, a photoresist material is first conformally formed over the substrate 202. In some embodiments, the photoresist material is formed by, for example, spin coating. The photoresist material is then exposed to a patterned light source, and the patterned photoresist material is developed to form the first photoresist layer 204 with the opening O1 therein, in which the pattern of the opening O1 is same as the patterned light source. The opening O1 in the photoresist layer 204 has a width, and the width is in a range from 470 angstrom to 530 angstrom in some embodiments. After forming the first photoresist layer 204 on a substrate 202, the substrate 202 is implanted to form an active area in the substrate 202, and the bitline contact (such as bitline contact 214 in FIG. 10) will be subsequently formed in the active area.

Figure 4:
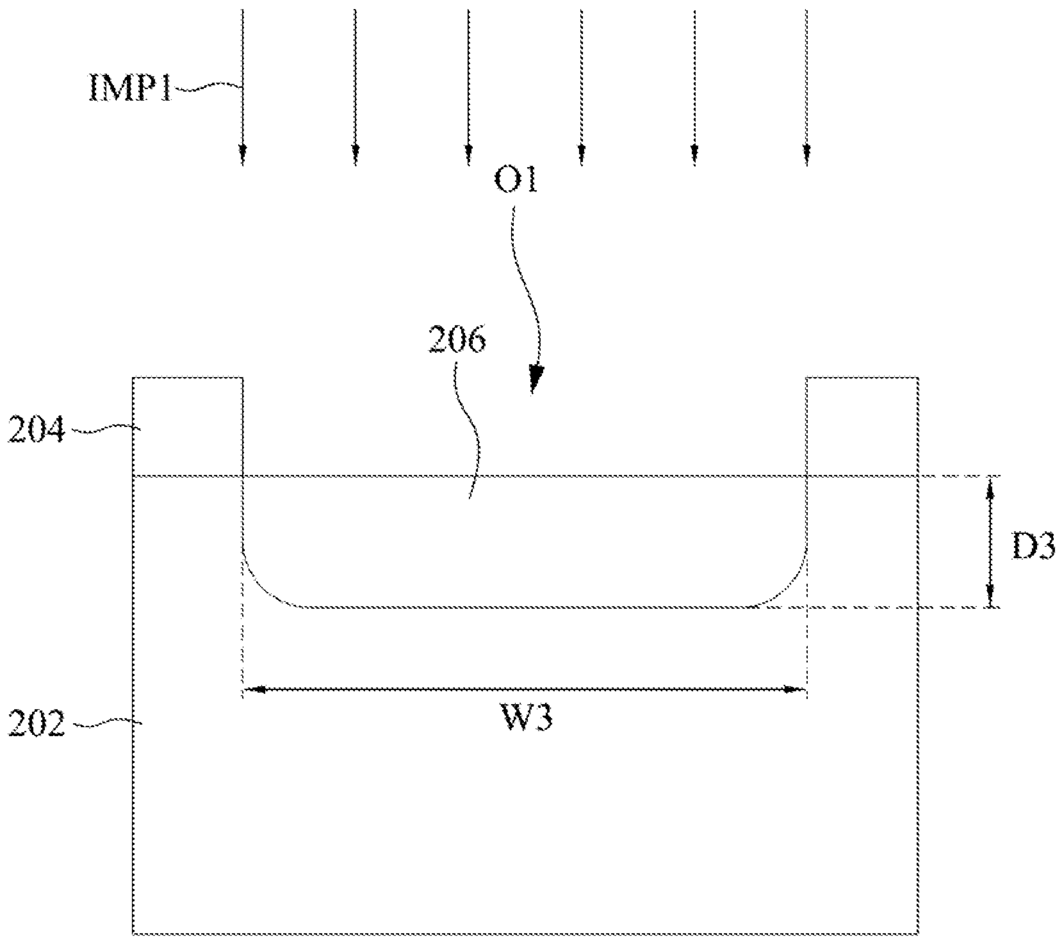

Referring to operation 14 in FIG. 2A and FIG. 4, an implant region 206 is formed in the portion of the substrate 202 by implanting first dopants into the substrate 202 by using the first photoresist layer 204 as a mask. More specifically, a first implantation process IMP1 is performed to implant the first dopants into the substrate 202. The implant region 206 is formed in the portion of the substrate 202 exposed by the opening O1 of the first photoresist layer 204. Implanting the first dopants into the substrate 202 to form the implant region 206 may lead to etching selectivity between the implant region 206 and the substrate 202. In some embodiments, the first dopants are n-type dopants, such as arsenic, phosphor, combinations thereof, or the like. Other dopants which are able to form an implant region with the etching selectivity different from the substrate 202 may be contemplated within the scope of disclosure.

In some embodiments, an implantation dosage and/or an implantation energy are adjusted when forming the implant region 206 in the portion of the substrate 202 to control a depth D3 of the implant region 206 and hence the subsequently formed recess (such as the recess in FIG. 6). For example, performing the first implantation process IMP1 at a high implantation dosage and a strong implantation energy may form an implant region 206 with the deep depth D3. On the other hands, performing the first implantation process IMP1 at a low implantation dosage and a weak implantation energy may form an implant region 206 with a shallow depth D3. In some embodiments, the implantation dosage is in a range from about $1\times10^{14}$ atom/cm$^2$ to about $1\times10^{16}$ atom/cm$^2$, such as $6\times10^{15}$ atom/cm$^2$, and the implantation energy is in a range from about 1 keV to about 10 keV, such as 2 keV. In some embodiments, the depth D3 of the implant region 206 is in a range from 160 angstrom to 200 angstrom. In some embodiments, an implantation angle of the first implantation process IMP1 with respect to the top surface of the substrate 202 is substantially 90°, i.e. the direction of implanting the first dopants to the substrate 202 is substantially vertical to the top surface of the substrate 202. Therefore, the boundary of the implant region 206 is substantially aligned with the sidewall of the opening O1 in the first photoresist layer 204, and a width W3 of the implant region 206 is substantially the same as the width of the opening O1 in the first photoresist layer 204.

Figure 5:
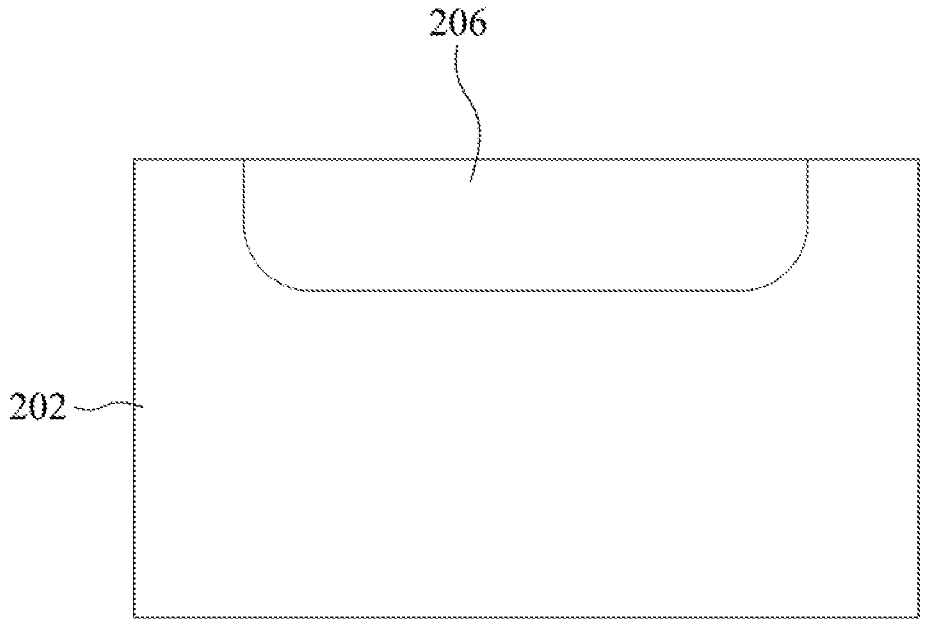

Referring to operation 15 in FIG. 2A and FIG. 5, the first photoresist layer 204 over the substrate 202 is removed. The first photoresist layer 204 is removing by any suitable method, such as stripping, ashing, or the like.

Figure 6:
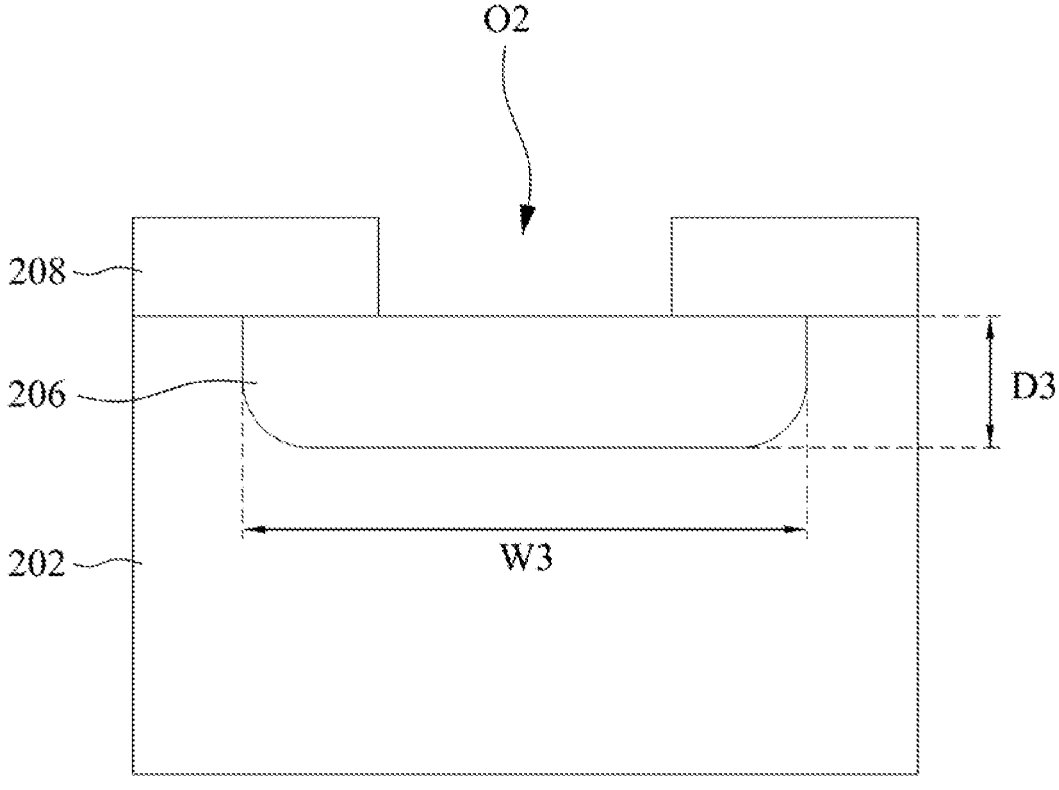

Referring to operation 16 in FIG. 2A and FIG. 6, a second photoresist layer 208 is formed over the substrate 202. The second photoresist layer 208 partially covers the implant region 206. More specifically, the second photoresist layer 208 has an opening O2 therein. The opening O2 is narrower than the opening O1 (FIG. 2) in the first photoresist layer 204. Therefore, the second photoresist layer 208 covers the peripheral portion of the implant region 206 and exposes the middle portion of the implant region 206. In some embodiments, the width of the opening O2 in the second photoresist layer 208 is in a range from 380 angstrom to 420 angstrom. The process of forming the second photoresist layer 208 is similar to or the same as that of the first photoresist layer 204. In some embodiments, the composition and the material of the second photoresist layer 208 are also similar to or the same as those of the first photoresist layer 204.

Figure 7:
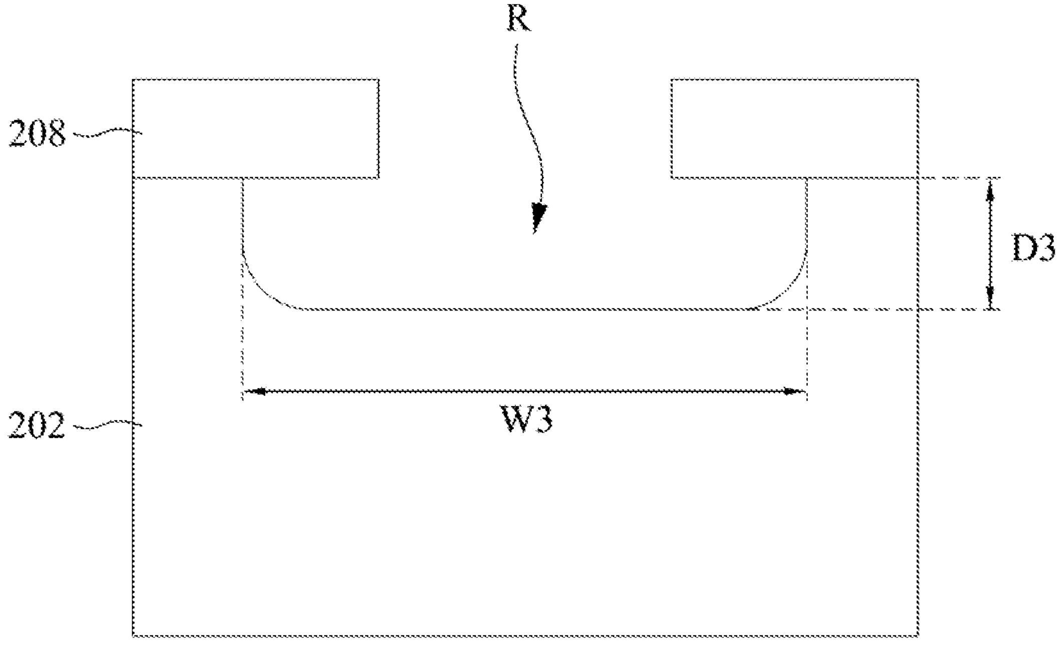

Referring to operation 17 in FIG. 2A and FIG. 7, a first etching process is performed to remove the implant region 206 such that a recess R is formed in the substrate 202. More specifically, because the implant region 206 and the substrate 202 have different etching selectivity, the implant region 206 is able to be removed by the first etching process while not removing the remaining portion substrate 202. The first etching process may be a dry etching using any suitable etchant. In some embodiments, the etchant may be a combination of chlorine and helium. Moreover, a suitable etching duration may be chosen to thoroughly remove the implant region 206. For example, the etching duration may be in a range from about 100 seconds to about 150 seconds. After the first etching process, a portion of the second photoresist layer 208 is suspended over the recess R in the substrate 202, and the recess R have a width W3 and a depth D3 same as the width W3 and the depth D3 of the implant region 206.

Figure 8:
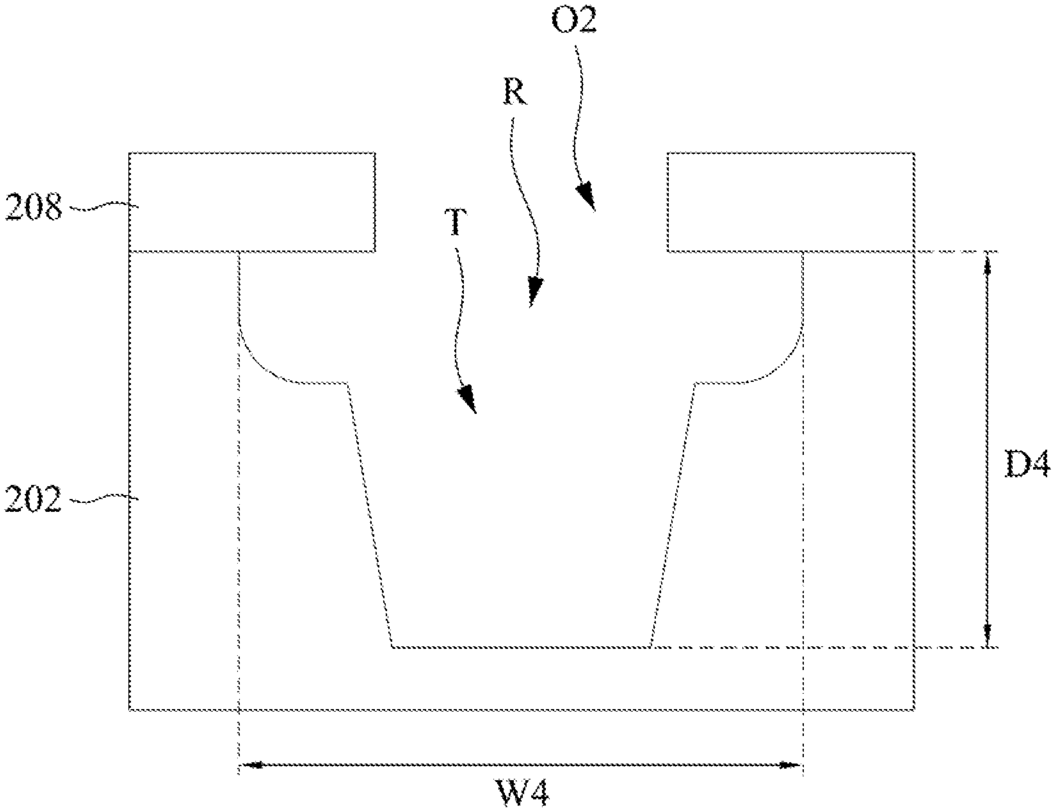

Referring to operation 18 in FIG. 2A and FIG. 8, a second etching process is performed to remove a portion of the substrate 202 to form a trench T in the substrate 202, and the trench T is narrower than the recess R in the substrate 202. Discussed in greater detail, the substrate 202 exposed by the opening O2 in the second photoresist layer 208 is vertically etched. Because the trench T is formed by using the second photoresist layer 208 as a mask, the width W4 of the trench T is the same as the width of the opening O2 in the second photoresist layer 208. The trench T is in the recess R and extends downwards from the recess R. In some embodiments, the trench T has a depth D4, and the depth D4 of the trench T is in a range from 400 angstrom to 440 angstrom. The second etching process may be a dry etching using any suitable etchant. In some embodiments, the etchant may be HBr gas.

Figure 9:
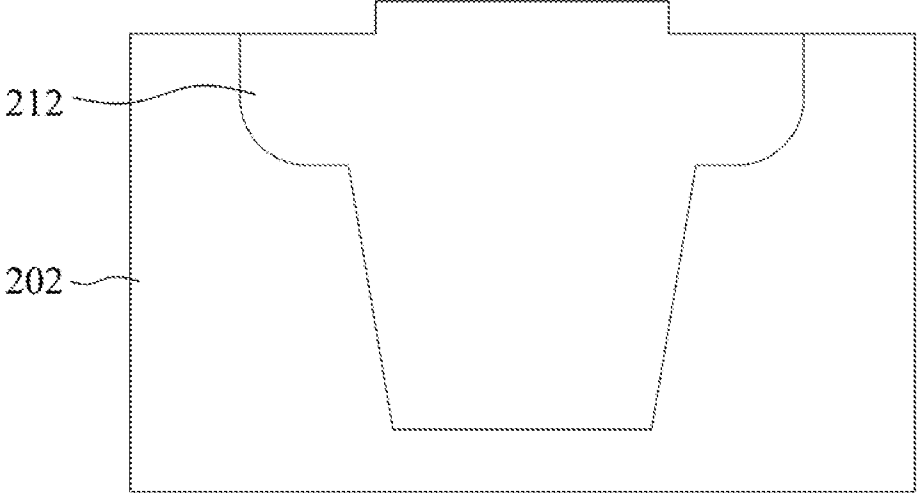

Referring to operation 19 in FIG. 2B and FIG. 9, the second photoresist layer 208 is removed after forming the trench T in the substrate 202. The second photoresist layer 208 is removing by any suitable method, such as stripping, ashing, or the like. Subsequently, referring to operation 20 in FIG. 2B, a semiconductive material 212 is deposited in the recess R and the trench T. The semiconductive material 212 may be any suitable semiconductive material. In some embodiments, the semiconductive material may be silicon. Any suitable method may be used to deposit the semiconductive material 212. In some embodiments, the semiconductive material 212 may be formed by chemical vapor deposition (CVD), physical deposition (PVD), atomic layer deposition (ALD), or the like.

Figure 10:
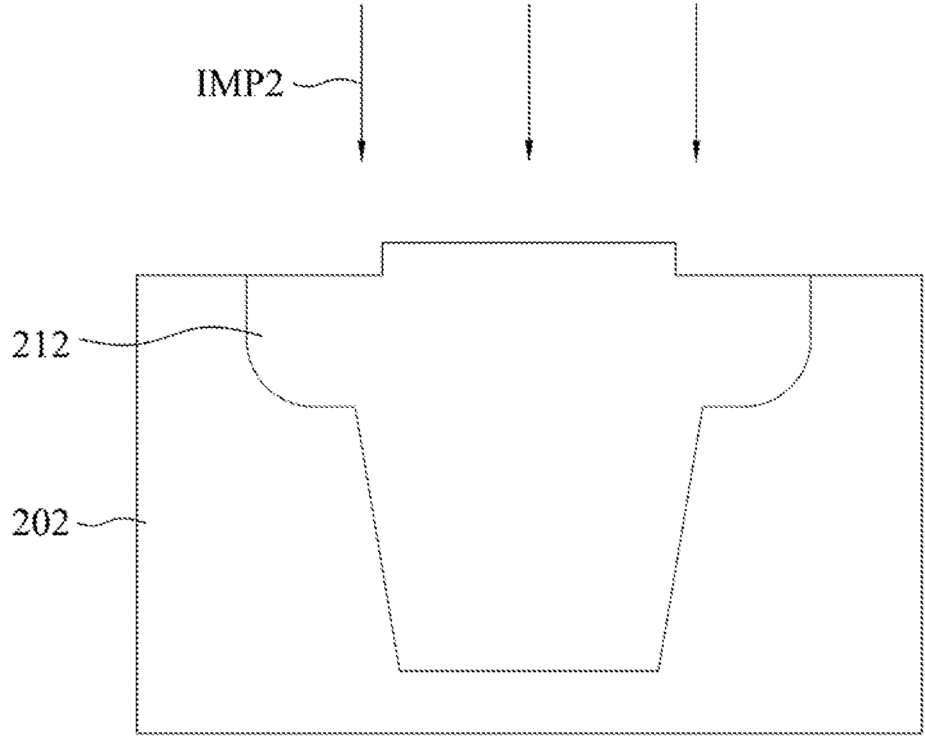
Figure 11:
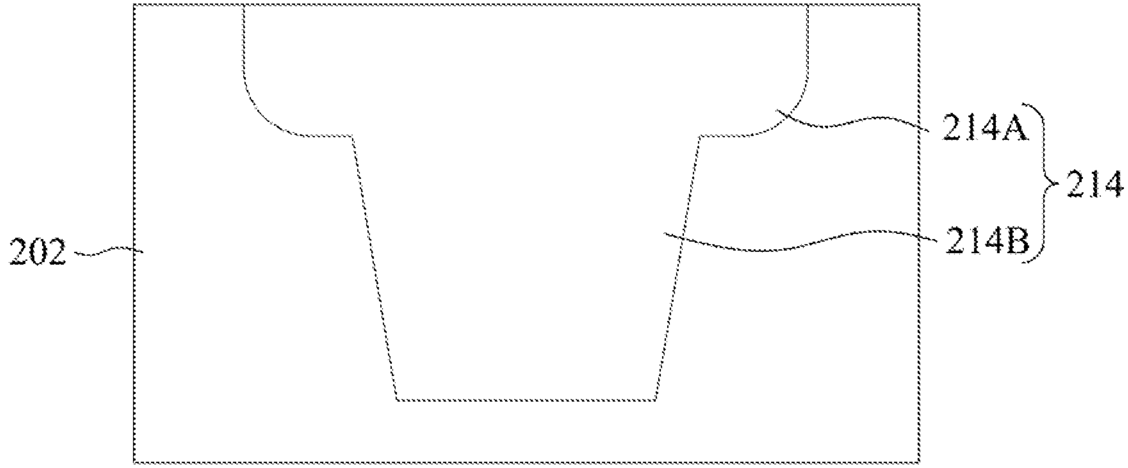

Referring to operation 21 in FIG. 2B and FIG. 10, second dopants are doped into the semiconductive material 212 in a second implantation process IMP2 after depositing the semiconductive material 212 in the recess R and the trench T. The second dopant has a smaller atomic radius than the semiconductive material 212. In some embodiments, the second dopants include carbon, phosphor, combinations thereof, or the like. Referring to operation 22 in FIG. 2B and FIG. 11, the semiconductive material 212 in the recess R is planarized by e.g. chemical mechanical polishing after the second implantation process IMP2. As such, the bitline contact 214 is formed in the substrate 202.

The bitline contact 214 includes a first portion 214A in the recess R and a second portion 214B in the trench T. The first portion 214A and the second portion 214B may correspond to the first portion 104A and the second portion 104B of the bitline contact 104 in FIG. 1. The dopant with smaller atomic radius provides tensile strain in the bitline contact 214. The tensile strain can enhance the electron mobility and hence increase the current from the bitline 112 in FIG. 1, and the wider first portion 214A of the bitline contact 214 enhance the effect resulting from the tensile strain. Moreover, the wider first portion 214A can also reduce the resistance of the bitline contact 214.

After forming the bitline contact 214, referring to operations 23-25 in FIG. 2B, a bitline (such as bitline 112 in FIG. 1) is formed on the bitline contact 214; a land pad (such as land pad 114 in FIG. 1) is formed adjacent to the word line (such as word line 106 in FIG. 1); and a capacitor (such as capacitor 116 in FIG. 1) is formed over the land pad. It is noted that although FIGS. 2A-2B and 3-11 illustrate the sequence of forming different components in the semiconductor device, the sequence of forming different components may be interchanged. For example, the word line 106 and the dielectric structure 108 may be formed after forming the bitline contact 214.

The bitline contact in some embodiments of the present disclosure provides some advantages. The shape of the bitline contact can enhance the tensile strain in the bitline contact. Discussed in greater detail, the bitline contact is doped with some dopants which are smaller in size than the semiconductive material, and adding the dopants can cause tensile strain in NMOS. The wider upper portion of the bitline contact can enhance the effect resulting from the tensile strain. Therefore, the tensile strain in NMOS can enhance the electron mobility and the current of NMOS.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a semiconductor device, comprising:

forming a first photoresist layer on a substrate, wherein the first photoresist layer has an opening exposing a portion of the substrate;

forming an implant region in the portion of the substrate by implanting a first dopant into the substrate by using the first photoresist layer as a mask;

removing the first photoresist layer over the substrate;

forming a second photoresist layer over the substrate, wherein the second photoresist layer partially covers the implant region;

performing a first etching process to remove the implant region such that a recess is formed in the substrate;

performing a second etching process to remove the portion of the substrate to form a trench in the substrate, wherein the trench is narrower than the recess in the substrate; and depositing a semiconductive material in the recess and the trench to form a bitline contact in the substrate.

2. The method of claim 1, further comprising doping a second dopant into the semiconductive material after depositing the semiconductive material in the recess and the trench.

3. The method of claim 2, wherein the second dopant has an atomic radius smaller than an atomic radius of the semiconductive material.

4. The method of claim 1, wherein the first dopant is an n-type dopant.

5. The method of claim 1, further comprising planarizing the semiconductive material in the recess after depositing the semiconductive material in the recess and the trench.

6. The method of claim 1, further comprising adjusting an implantation dosage when forming the implant region in the portion of the substrate to control a depth of the recess.

7. The method of claim 1, further comprising adjusting an implantation energy when forming the implant region in the portion of the substrate to control a depth of the recess.

8. The method of claim 1, wherein performing the first etching process is such that a portion of the second photoresist layer is suspended over the recess in the substrate.

* * * * *